United States Patent
Petruzello et al.

[11] Patent Number: 6,088,375
[45] Date of Patent: Jul. 11, 2000

[54] SEMICONDUCTOR DEVICE COMPRISING P-TYPE ZNMGSSE LAYER

[75] Inventors: John Petruzello, Carmel; Thomas Marshall, Hartsdale, both of N.Y.

[73] Assignee: Philips Electronics North America Corporation, New York, N.Y.

[21] Appl. No.: 09/031,697

[22] Filed: Feb. 27, 1998

[51] Int. Cl.$^7$ ............................................. H01S 3/18
[52] U.S. Cl. ............................. 372/45; 372/43; 372/44; 372/46; 372/50
[58] Field of Search ............................... 372/43, 44, 45, 372/46, 50

[56] References Cited

U.S. PATENT DOCUMENTS

| | | | |
|---|---|---|---|
| 5,363,395 | 11/1994 | Gaines et al. | 372/45 |
| 5,515,393 | 5/1996 | Okuyama et al. | 372/45 |
| 5,619,520 | 4/1997 | Sasai et al. | 372/46 |
| 5,665,977 | 9/1997 | Ishibashi et al. | 257/17 |
| 5,742,629 | 4/1998 | Nishikawa et al. | 372/46 |

FOREIGN PATENT DOCUMENTS

| | | | |
|---|---|---|---|
| 0638969A1 | 2/1995 | European Pat. Off. | 372/45 |
| 0680122A2 | 11/1995 | European Pat. Off. | 372/45 |

*Primary Examiner*—Brian Healy
*Attorney, Agent, or Firm*—Norman N. Spain

[57] ABSTRACT

A II-VI semiconductor device has a p-doped quaternary ZnMgSSe layer formed of undoped sublayers and p-doped sublayers.

22 Claims, 1 Drawing Sheet

SEMICONDUCTOR DEVICE COMPRISING P-TYPE ZNMGSSE LAYER

BACKGROUND OF THE INVENTION

This invention relates to semiconductor devices comprising P-type quaternary ZnMgSSe layers.

This invention relates especially to semiconductor laser structures formed from II-VI materials having P-type quaternary ZnMgSSe layers that emit light in the blue-green region and laser diodes comprising such structures.

This invention relates especially to laser structures and laser diodes having an n-type semiconductor substrate, a p-type quaternary ZnMgSSe cladding layer and a ternary ZnCdSe active layer.

Laser structures of this type are described in European Patent Application 0 605 051 A1 published Jun. 7, 1994 and in Gaines et al. U.S. Pat. No. 5,363,395, the contents of which are hereby incorporated by references.

As shown in the above-mentioned references, the dopant concentration in the p-type cladding layer is not greater than $2 \times 10^{17}$ cm$^{-3}$. It has also been found that the mobilities of the dopants therein are not greater than 4 cm.$^2$/volt. sec.

As a result of this rather low dopant concentration and mobility, resistant layers are formed in this cladding layer resulting in a decrease of the conductivity of this cladding layer and requiring an increase in the operating voltage of the laser structure.

SUMMARY OF THE INVENTION

It is an object of this invention to provide a semiconductor device having a p-type quaternary ZnMgSSe layer of an increased doping level and dopant mobility.

It is an additional object of this invention to provide a semiconductor laser structure and a laser diode of the above-mentioned type having a p-type quaternary ZnMgSSe cladding layer of an increased doping level and dopant mobility.

It is a still further object of this invention to provide a semiconductor structure and laser diode of the above-mentioned type requiring a smaller operating voltage.

These and other objects of the invention will be apparent from the description that follows.

According to first alternative feature of one aspect of the invention a p-type quaternary ZnMgSSe layer provided in a semiconductor device consists essentially of alternate sub-layers of undoped ZnMgSSe and sub-layers of ZnSe p-doped with N, the thickness of each of the sub-layers of undoped ZnMgSSe being larger than each of the sub-layers of p-doped ZnSe.

According to a second alternative feature of this aspect of the invention a p-type quaternary ZnMgSSe layer provided in a semiconductor device consists essentially of alternate sub-layers of undoped ZnMgSe and sub-layers of ZnSSe p-doped with N, the thickness of each of the sub-layers being approximately the same.

According to an additional aspect of the invention a semiconductor laser structure is provided comprising a semiconductor substrate of a first conductivity type, a first cladding layer of this first conductivity type of quaternary $Zn_{1-x}Mg_xS_ySe_{1-y}$ disposed atop the substrate, a first guiding layer of ternary $ZnS_ySe_{1-y}$ disposed atop the first cladding layer, an undoped active layer of ternary $Zn_{1-u}Cd_uSe$ disposed atop the first guiding layer, a second guiding layer of ternary $ZnS_xSe_{1-x}$ disposed atop the active layer remote from the substrate and a second cladding layer of a second conductivity type opposite to the first conductivity type of quaternary $Zn_{1-x}Mg_xS_ySe_{1-y}$ disposed atop the second guiding layer. Further according to the invention one of the cladding layer is p-type. In the above-noted chemical formulae $0<u<0.4, 0<x<1, 0.06<y<1$ and x and y are so chosen so that the cladding layer disposed atop the substrate is lattice matched to the substrate.

Additionally according to a first alternative feature of this additional aspect of the invention the p-type cladding layer consists essentially of alternate sub-layers of undoped quaternary $Zn_{1-x}Mg_xS_ySe_{1-y}$ and sub-layers of ZnSe p-doped with N, the thicknesses of each of the sub-layers of undoped quaternary $Zn_{1-x}Mg_xS_ySe_{1-y}$ being larger than each of the thicknesses of each of the sub-layers of the p-doped ZnSe and the total thickness of the p-type cladding layer being about 0.5–3.0 µm.

According to a second alternative feature of this aspect of the invention the p-type cladding layer consists essentially of alternate sub-layers of undoped ternary $Zn_xMg_{1-x}Se$ and sub-layers of ternary $ZnS_ySe_{1-y}$ p-doped with N, the thicknesses of the undoped ternary sub-layers and of the doped ternary sub-layers being approximately the same and the total thickness of the p-type cladding layer being about 0.5–3.0 µm.

According to another aspect of the invention a semiconductor laser diode is provided in which the above-described laser structure of the invention has an electrode layer provided on the surface of the substrate remote from the n-type cladding layer, a contact layer disposed atop the p-type cladding layer remote from the substrate and an electrode layer disposed atop the contact layer.

The semiconductor laser structures and semiconductor laser diodes of the invention exhibit the advantage of requiring a significantly lower operating voltage than the most closely related known laser structures and laser diodes.

Preferably, in the semiconductor laser structures and the semiconductor laser diodes of the invention the semiconductor substrate is n-doped and the cladding layer provided atop the substrate is n-doped.

Generally the thickness of the p-type quaternary ZnMgSSe cladding layer of the invention is about 0.8=1.0 µm.

When this cladding layer is formed of alternate layers of undoped quaternary ZnMgSSe and N-doped ZnSe the thicknesses of the layers of undoped quaternary ZnMgSSe are about 50–100 Å and the thicknesses of the N-doped ZnSe layers are about 6–120 Å. The dopant concentrations of the doped ZnSe layers are about $0.5-2 \times 10^{18}$ µm$^{-3}$.

When this cladding layer is formed of alternate layers of ternary ZnSSe doped with N and undoped ZnMgSe, the thicknesses of both the ternary ZnSSe and ZnMgSe are about 14–50 Å. Here, the dopant concentrations of the doped layers are about $2^-8 \times 10^{17}$ µm$^{-3}$.

Generally the guiding layers, the active layer and the n-type cladding layer of the laser structure of the invention are all deposited by molecular beam epitoxy. These layers can be deposited, for example, in the manner shown in the above-noted Gaines et al. U.S. Pat. No. 5,363,395.

According to an additional aspect of the invention improved laser diodes employing the laser structures of the invention are provided. Here an electrode layer is provided on the surface of the substrate remote from the N-doped cladding layer, a contact layer is provided on the surface of the n-type cladding layer and an additional electrode layer is provided on the surface of the contact layer.

Preferably the contact layer is a composition of the formula $Zn_mTe_{1-m}$ wherein $0<m<1$ with the value of m increasing in the direction of the electrode layer.

Examples of electrode layers that may be provided on the substrate include a combination of a layer of Au and a layer of Ti or a combination of a layer of Pd, a layer of Ge and a layer of Au with the layer of Au remote from the substrate.

Examples of electrode layers that may be provided on the contact layer include a combination of a layer of Au and a layer of Pd or of a combination of a layer of Au and a layer of Pt with the layer of Au remote from the contact layer.

The substrate preferably comprises GaAs n-doped with Si.

BRIEF DESCRIPTION OF THE DRAWING

The sole FIGURE of the drawing is a cross-sectional view of a semiconductor blue-green laser diode of the invention.

DETAILED DESCRIPTION OF THE INVENTION

Figure 1:
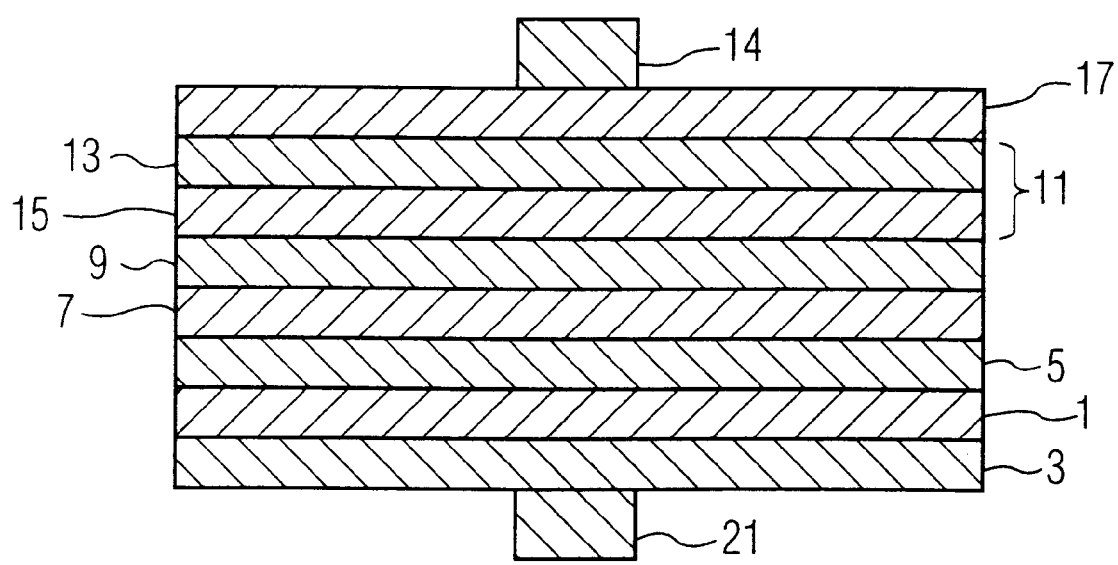

For a better understanding of the invention the invention will now be described in greater detail with reference to the sole FIGURE of the drawing which is a cross-sectional view of a semiconductor diode of the invention.

A first 1 µm thick quaternary cladding layer 1 of n-type $Zn_{0.9}Mg_{0.1}S_{0.14}Se_{0.86}$ doped with Si is provided on a n-type GaAs (001) substrate 3 doped with Si.

Employing the procedure disclosed in the above-noted Gaines et al. patent, a first guiding layer 5 of ternary $ZnS_zSe_{1-z}$ where the value of z is as shown in the patent and which layer may be n-type or may be undoped was deposited on the first cladding layer 1.

Following this, and also employing procedures disclosed in the above-noted Gaines et al. patent, an active layer 7 of $Zn_{1-u}Cd_uSe$, and a second guiding layer 9 of p-type or undoped ternary $ZnS_zSe_{1-z}$ were deposited.

A second cladding layer 11 of p-type $Zn_{0.9}Mg_{0.1}S_{0.14}Se_{0.86}$ was deposited on the second guiding layer 9 in the following manner: The cladding layer 11 was formed of alternate sub-layers of 5 nm thick undoped $Zn_{0.9}Mg_{0.1}S_{0.14}Se_{0.86}$ 13 and 0.6 nm thick sub-layers of p-type ZnSe doped with N 15 for a total of about 360 sub-layers.

These sub-layers were grown by molecular beam epitoxy using Zn,Se,ZnS and $N_2$ (RF plasma) as the source materials.

The p-type doping of the ZnSe sub-layers were performed by two methods which gave similar results. In the first method a uniform doping of the ZnSe sub-layer was achieved. Here the N source was opened simultaneously with the Zn and Se sources during the growth of the ZnSe sub-layer. In the second method is a spike or delta doping in which half (0.3 nm) of the sub-layer of ZnSe was grown with the N source closed, the N and Zn sources only were then open for 5–10 seconds, no Zn Se being formed, and the other half of the ZnSe sublayer was then grown with the N source closed.

Two samples employing each alternate doping method (uniform and delta) for a total of four samples of the cladding layer 11 were grown. The net acceptor level of these samples, which was similar for all the samples, was 3 to $4\times10^{17}$ cm$^{-3}$ which is a factor of about three times better than that achieved by conventional doping.

The mobility values of the quaternary layers of these samples were similar to those of conventionially doped quaternary layers.

The semiconductor laser diode shown in the FIGURE of the drawing has, provided on the second cladding layer 11, a contact layer 17 of $Zn_mTe_{1-m}$, where $0<m<1$ and the value of m decreases in the direction of the cladding layer, an electrode layer 19 of AuPd provided on the contact layer 17 with Pd in contact with the contact layer and an electrode layer 21 of Ti Au provided on the surface of the substrate remote from the first cladding layer 1 with Ti in contact with the substrate.

What is claimed is:

1. A semiconductor device comprising a p-type layer of ZnMgSSe, said p-type layer consisting essentially of alternate sub-layers of undoped ZnMgSe and ZnSSe p-doped with N, the thickness of each of the undoped sub-layers p-doped with N being approximately the same.

2. A laser structure comprising:
    (a) a semiconductor substrate of a first conductivity type,
    (b) a cladding layer of said first conductivity type of quaternary $Zn_{1-x}Mg_xS_ySe_{1-y}$ disposed atop of said substrate,
    (c) a first guiding layer of $ZnS_zSe_{1-z}$ disposed atop of said cladding layer of said first conductivity type,
    (d) an active layer of $Zn_{1-u}Cd_uSe$ disposed atop said first guiding layer,
    (e) a second guiding layer of $ZnS_zSe_{1-z}$ provided atop said active layer remote from said first guiding layer,
    (f) a cladding layer of a second conductivity type opposite to said first conductivity type of quaternary $Zn_{1-x}Mg_xS_ySe_{1-y}$ disposed on said second guiding layer remote from said substrate,
    one of said cladding layers being p-type and consisting essentially of alternate sub-layers of undoped quaternary $Zn_{1-x}Mg_xS_ySe_{1-y}$ and sub-layers of ZnSe p-doped with N, the total thickness of said p-type cladding layer being about 0.5–3.0 µm and each of the sub-layers of the undoped quaternary $Zn_{1-x}Mg_xS_ySe_{1-y}$ being thicker than each of the sublayer of p-doped ZnSe and wherein $0<u<0.4$, $0<x<1$, $0.06<y<1$ and wherein x and y being so chosen that the cladding layer disposed atop the substrate is lattice matched to the substrate.

3. A laser structure comprising:
    (a) a semiconductor substrate of a first conductivity type,
    (b) a cladding layer of said first conductivity type of quaternary $Zn_{1-x}Mg_xS_ySe_{1-y}$ disposed atop of said substrate,
    (c) a first guiding layer of $ZnS_ySe_{1-y}$ disposed atop of said cladding layer of said first conductivity type,
    (d) an active layer of $Zn_{1-u}Cd_uSe$ disposed atop said first guiding layer,
    (e) a second guiding layer of $ZnS_zSe_{1-z}$ provided atop said active layer remote from said first guiding layer,
    (f) a cladding layer of a second conductivity type opposite to said first conductivity type of quaternary $Zn_{1-x}Mg_xS_ySe_{1-y}$ disposed on said second guiding layer remote from said substrate,
    one of said cladding layers being p-type and consisting essentially of alternate sub-layers of undoped ternary $Zn_{1-x}Mg_xSe$ and ternary $ZnS_zSe_{1-z}$ p-doped with N, the total thickness of the p-type cladding layer being about 0.5–3.0 µm and wherein $o<u<0.4$, $0<x<1$, $0.06<y<1$ and wherein x and y are so chosen that the cladding layer disposed atop the substrate is lattice matched to the substrate.

4. The laser structure of claim 2 wherein the substrate n-type and the cladding layer atop the substrate is n-type.

5. The laser structure of claim 4 wherein each of the sub-layers of p-doped ZnSe has a thickness of about 6–12 Å and each of the sub-layers of undoped quaternary $Zn_{1-x}Mg_xS_ySe_{1-y}$ of about 50–100 Å.

6. The laser structure of claim 2 wherein N is provided essentially uniformly throughout each of the ZnZe sub-layers.

7. The laser structure of claim 5 wherein N is provided essentially uniformly throughout each of the ZnSe sub-layers.

8. The laser structure of claim 2 wherein each of the ZnSe sub-layers is delta doped with N.

9. The laser structure of claim 5 wherein each of the ZnSe sub-layers is delta doped with N.

10. The laser structure of claim 4 wherein the substrate comprises GaAs.

11. The laser structure of claim 5 wherein the substrate comprises GaAs.

12. The laser structure of claim 3 wherein the substrate is n-type and the cladding layer atop the substrate is n-type.

13. The laser structure of claim 12 wherein the thickness of each of the sub-layers is about 14–50 Å.

14. The laser structure of claim 12 wherein the substrate comprises GaAs.

15. The laser structure of claim 13 wherein the substrate comprises GaAs.

16. A semiconductor laser diode adapted for emitting light in the blue-green region, said diode comprising
 (a) the laser structure of claim 4,
 (b) a first electrode layer disposed on the substrate remote from the n-type cladding layer,
 (c) a contact layer disposed on the p-type cladding layer remote from the substrate and
 (d) a second electrode layer disposed on the contact layer remote from the p-type cladding layer.

17. A semiconductor laser diode adapted for emitting light in the blue-green region, said diode comprising
 (a) the laser structure of claim 12,
 (b) a first electrode layer disposed on the substrate remote from the n-type cladding layer,
 (c) a contact layer disposed on the p-type cladding layer remote from the substrate and
 (d) a second electrode layer disposed on the contact layer remote from the p-type cladding layer.

18. A semiconductor laser diode adapted for emitting light in the blue-green region, said diode comprising
 (a) the laser structure of claim 12,
 (b) a first electrode layer disposed on the substrate remote from the p-type cladding layer,
 (c) a contact layer disposed on the n-type cladding layer remote from the substrate and
 (d) a second electrode layer disposed on the contact layer remote from the n-type cladding layer.

19. A semiconductor laser diode adapted for emitting light in the blue-green region, said diode comprising
 (a) the laser structure of claim 11,
 (b) a first electrode layer disposed on the substrate remote from the p-type cladding layer,
 (c) a contact layer disposed on the n-type cladding layer remote from the substrate and
 (d) a second electrode layer disposed on the contact layer remote from the n-type cladding layer.

20. The semiconductor laser diode of claim 18 wherein the contact layer is $Zn_mTe_{m-1}$ and wherein the value of m increases from 0 to 1 in the direction of the second electrode layer.

21. The semiconductor laser diode of claim 19 wherein the contact layer is $Zn_mTe_{m-1}$ and wherein the value of m increases from 0 to 1 in the direction of the second electrode layer.

22. A semiconductor device comprising a p-type layer of quaternary ZnMgSSe, said p-type layer consisting essentially of alternate sub-layers of undoped ZnMgSSe and sub-layers of ZnSe p-doped with N, the thickness of each of the sub-layers of undoped ZnMgSSe being larger than each of the sub-layers of p-doped ZnSe.

* * * * *

UNITED STATES PATENT AND TRADEMARK OFFICE
CERTIFICATE OF CORRECTION

PATENT NO. : 6,088,375

DATED : July 11, 2000

INVENTOR(S) : John Petruzzello, et al.

It is certified that error appears in the above-identified patent and that said Letters Patent is hereby corrected as shown below:

In the Drawing, the item indicated as "14" should be --19--.

Signed and Sealed this

Seventeenth Day of April, 2001

Attest:

NICHOLAS P. GODICI

*Attesting Officer*       *Acting Director of the United States Patent and Trademark Office*